(12) United States Patent
Shabany

(10) Patent No.: US 7,701,714 B2
(45) Date of Patent: Apr. 20, 2010

(54) LIQUID-AIR HYBRID COOLING IN ELECTRONICS EQUIPMENT

(75) Inventor: Younes Shabany, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 186 days.

(21) Appl. No.: 11/623,430

(22) Filed: Jan. 16, 2007

(65) Prior Publication Data

US 2007/0274043 A1 Nov. 29, 2007

Related U.S. Application Data

(60) Provisional application No. 60/803,320, filed on May 26, 2006.

(51) Int. Cl.
  H05K 7/20 (2006.01)
  F28F 7/00 (2006.01)
  H05K 5/00 (2006.01)
  F25D 23/12 (2006.01)

(52) U.S. Cl. .................. 361/698; 361/699; 361/695; 361/701; 165/80.4; 165/80.5; 165/104.33; 454/184; 62/259.2

(58) Field of Classification Search .................. 361/695, 361/696, 698, 699, 701, 724–726; 165/80.4, 165/80.5; 454/184; 62/259.2; 285/19, 124.3, 285/124.4
See application file for complete search history.

(56) References Cited

U.S. PATENT DOCUMENTS

| 5,316,347 | A | * | 5/1994 | Arosio | 285/26 |
|---|---|---|---|---|---|
| 5,946,191 | A | * | 8/1999 | Oyamada | 361/700 |
| 6,388,880 | B1 | | 5/2002 | El-Ghobashy et al. | |
| 6,462,949 | B1 | | 10/2002 | Parish, IV et al. | |
| 6,714,411 | B2 | | 3/2004 | Thompson et al. | |
| 6,714,412 | B1 | * | 3/2004 | Chu et al. | 361/699 |
| 6,839,233 | B2 | | 1/2005 | Cravens et al. | |
| 6,878,874 | B2 | | 4/2005 | Osborn et al. | |
| 6,888,720 | B2 | * | 5/2005 | Pfister et al. | 361/689 |
| 6,912,129 | B2 | | 6/2005 | Baker et al. | |
| 6,924,981 | B2 | | 8/2005 | Chu et al. | |
| 6,932,696 | B2 | | 8/2005 | Schwartz et al. | |
| 6,987,673 | B1 | | 1/2006 | French et al. | |
| 7,428,151 | B2 | * | 9/2008 | Sonnabend et al. | 361/699 |
| 2004/0057211 | A1 | * | 3/2004 | Kondo et al. | 361/696 |
| 2004/0221604 | A1 | * | 11/2004 | Ota et al. | 62/259.2 |
| 2005/0286222 | A1 | | 12/2005 | Lucero et al. | |
| 2006/0002084 | A1 | | 1/2006 | Wei | |

* cited by examiner

Primary Examiner—Zachary M Pape
(74) Attorney, Agent, or Firm—Russell T. Manning; Robert G. Crouch; Marsh Fischmann & Breyfogle, LLP

(57) ABSTRACT

Provided herein are hybrid-cooled electronics chassis and boards. Such boards may be plugged in a chassis and connected to a common liquid-cooling loop shared by two or more of the boards inside that chassis. Liquid cooling conduits between the electronics board/module and the chassis are engaged and disengaged with little or no manual intervention. For instance, the connections between such cooling conduits may utilize quick coupling connectors that allow for automatic or near automatic engagement and disengagement upon the engagement of the electronics board/module with the electronics chassis. In one arrangement, a chassis includes a base portion that has a fan, liquid cooling system and heat exchanger mounted thereon. An electronics module is selectively engageable with the base portion in a manner to have air displaced across the electronics module when engaged as well establish liquid flow through the electronics module when engaged.

11 Claims, 11 Drawing Sheets

LIQUID-AIR HYBRID COOLING IN ELECTRONICS EQUIPMENT

CROSS-REFERENCE TO RELATED APPLICATION

This application claims priority under 35 U.S.C. §119 to U.S. Provisional Application No. 60/803,320 having a filing date of May 26, 2006, the contents of which are incorporated by reference herein.

BACKGROUND

A variety of techniques are used for cooling enclosed electronic equipment to maintain a predetermined temperature range for the components included therein. These techniques include providing ventilation in the enclosure to allow heat to escape, improving radiation properties of surfaces to increase the radiation of heat away from the enclosure, adding fans to force cooler air from outside the enclosure across the components therein and thereby to force heat out of the enclosure, using liquid fluid flow through, for example, "cold plates" which are placed on hot components in the enclosure in order to remove heat from those components.

Enclosed telecommunications equipment is one example of electronic equipment typically requiring forced air or liquid cooling. Many electronic boards that are used in rack-mount telecom chassis and many small form factor electronic enclosures, such as 1 U-high servers, have a few components that generate a majority of the heat. Examples are power amplifiers on a radio module and microprocessors in a 1 U-high server or an ATCA (Advanced Telecom Computing Architecture) board.

Currently in most electronic equipment, two different cooling approaches are used; pure air-cooled systems or hybrid-cooled systems. In pure air-cooled systems, all components are cooled by traditional air-cooled heat sinks. To sufficiently cool a few high power components, very high airflow rates and/or large and/or expensive heat sinks are needed. A high airflow rate is usually accomplished by using either large fans or high speed fans. However, this may have a cost and/or noise impact, since large fans are typically more expensive and high speed fans are typically noisy. Further, the high airflow required for cooling the high power density components may be much more than what is necessary for cooling the remainder of the electronics inside the system. Another limitation of this brute-force air cooling technique is that the cooling capacity does not increase proportionally as the airflow rate increases; in fact the improvement in cooling capacity becomes smaller and smaller as the rate of airflow keeps increasing.

Generally, a shortcoming of pure air-cooled systems is that the cooling capacity is limited by the allowable acoustic noise level emitted from the chassis. Further, the increase in cooling capacity diminishes as airflow rate increases. Accordingly, this may sometimes require significant increase in airflow rate and noise level to meet cooling requirements. Further, fans may be operating at high ambient temperatures if they are mounted at exhaust, which may reduce the service life of the fans. And finally, in many cases, the airflow required to cool a few high power dissipating components is disproportionably higher than the airflow that is needed to cool other components in the system.

Current liquid-cooled or hybrid-cooled solutions come in two varieties: those with the entire liquid loop and the fans inside the enclosure; and those with part of the liquid loop located outside of the enclosure and the remainder of the liquid loop plus the fans located inside the enclosure. In the latter case, some manual piping work is needed during installing and removing the equipment or board.

For systems that contain the entire liquid-loop (including the heat exchanger and pump) inside the enclosure, there is no liquid line coming into or out of these enclosures. As far as someone outside of these chassis is concerned, they appear to be air-cooled as cold air enters and hot air exits such chassis. Internally, these chassis are hybrid-cooled chassis since some of the components therein are cooled by cold-plates of the liquid cooling system, while other components are cooled by air with or without heat sinks. The fans that push air through the heat exchanger of the liquid cooling system and/or cool other air-cooled electronics, are inside the chassis as well.

A second group of liquid-cooled or hybrid-cooled chassis is those that receive cooling liquid from outside the enclosure and send the coolant liquid, after it absorbs heat from hot components, outside the chassis for cooling. The heated coolant liquid from the chassis, possibly mixed with the heated coolant liquid coming from other chassis, is circulated through an outside heat exchanger or a chiller that cools the coolant before the coolant returns to the chassis. These chassis usually require extensive piping work during installation or removal. If these chassis are hybrid-cooled, they each will include their own fans.

The shortcomings of existing liquid or hybrid-cooled systems includes the number of moving parts (such as fans and pumps) inside a rack increases proportionally to the number of electronics enclosures in the rack. This will reduce the reliability of the enclosure and rack in general. In addition, each individual enclosure has to use smaller size pumps, fans, and heat exchangers such that the components will fit inside the enclosures. In general, smaller fans and pumps are less efficient than larger ones. If part of the liquid loop is outside the enclosure, there is typically piping work involved to install or remove an enclosure from a rack.

The foregoing examples of the related art and limitations related therewith are intended to be illustrative and not exclusive. Other limitations of the related art will become apparent to those of skill in the art upon a reading of the specification and a study of the drawings.

SUMMARY

In view of the foregoing limitations, the inventor has recognized that there is no hybrid-cooled board/electronics module that can be plugged in a chassis and connected to a common liquid-cooling loop shared by two or more (e.g., all) of the boards/modules inside that chassis. Accordingly, it would be desirable to provide a hybrid cooled electronic chassis that allows for the insertion and withdrawal of electronics boards/modules into and from the chassis where liquid cooling conduits between the electronics module and the chassis are engaged and disengaged with little or no manual intervention. For instance, the connections between these cooling conduits of the electronics module and the electronics chassis may utilize quick coupling connectors that allow for automatic or near automatic engagement and disengagement upon the engagement of the electronics module with the electronics chassis.

According to one aspect, a hybrid cooling system is provided for use within an electronics chassis. As provided, the chassis includes a base portion that has a fan and heat exchanger mounted thereon. An electronics module is selectively engageable with the base portion in a manner to have air displaced across the electronics module when engaged. The electronics module also includes a conduit for carrying cooling fluid that may be utilized to cool one or more portions of the electronic module. The conduit includes an inlet connector and an outlet connector for connection with a source of cooling fluid associated with the base portion of the chassis. In this regard, the base portion includes conduits that are in fluid communication with the heat exchanger. These conduits include mating connectors for connection to the inlet and outlet connectors of the electronics module. The inlet and outlet connectors of the electronics module couple with the mating connectors of the base portion when the electronics module is engaged with the base portion. Further, a fluid flow path may be established through the conduit of the electronics module for cooling purposes. In this regard, the airflow may be passed over a surface of the electronics module in conjunction with fluid flow passing through the conduit on the electronics module. The base portion will typically further include a pump that is located thereon and which is in fluid communication with the heat exchanger and conduits in order to move fluid through the conduits and the heat exchanger and, hence, the electronics module.

In addition to coupling with the mating connectors of the base portion when the electronics module is engaged, the inlet and outlet connectors of the electronics module are also operative to disengage the mating connectors when the electronics is disengaged from the base portion. Further, the mating connectors and/or the inlet and outlet connectors of the electronics module may be operative to form a fluid-tight seal upon disengagement. In this regard, such connectors may be drip-free connectors that prevent fluid spillage within the electronics chassis.

In one arrangement, the inlet and outlet connectors and mating connectors are fully automated such that coupling may occur free of any manual interaction with the connectors and without tools contacting the connectors. In another arrangement, the electronics module or the base portion of the chassis may include a trigger that allows for moving a portion of the respective connectors between an engagement and locked position. In this regard, the trigger may be displaced to allow for engagement of the electronics module and then released to lock the module therein.

In a further arrangement, the system may include a plurality of electronics modules where each electronics module is selectively engageable with a base portion of the chassis in a manner to have air displaced across the module and that allows for connecting a fluid-cooling conduit with a fluid cooling system of the chassis. In this regard, a plurality of electronics modules may utilize a common fluid cooling system of the chassis. That is, cooling fluid from a plurality of electronics modules may be circulated by one or more common pump(s) and/or through one or more common heat exchanger(s). In this regard, a plurality of mating connectors on the chassis may be operative to interconnect with inlet and outlet conduits of a plurality of individual electronics modules.

The system may be utilized in one or more different chassis configurations. For instance, the base portion, including the fan and heat exchanger, as well as the electronics modules, may be housed within a common structure. In one arrangement, such a common structure may include vertical sidewalls wherein the electronics modules are vertically aligned with the sidewalls. In such an arrangement, the chassis may be compatible with ATCA standards. In other arrangements, the chassis may include a plurality of individual modules that are horizontally disposed between opposing sidewalls. An example is a cabinet or rack including 1 U, 2 U, etc. electronics modules such as servers.

In one arrangement, a fan within the chassis is adapted to both provide airflow across the electronics module(s) disposed therein, as well as provide airflow circulation over the heat exchanger. In one arrangement, the fan is operative to draw air across the electronics module(s) while blowing air across the heat exchanger. In another arrangement, different sets of fans may be utilized to generate airflow within the chassis. In such arrangements, airflow may be blown across the electronics module(s) and/or drawn across the module(s) in conjunction with blowing and/or drawing air across the heat exchanger.

According to another aspect, an electronics chassis is provided for housing a plurality of selectably engageable electronics modules and providing airflow and liquid cooling for electronics modules engaged therein. The chassis includes a housing that defines an interior area and at least a first fan that is disposed within the housing and which is adapted to displace air through the interior area thereof. A fluid cooling system is disposed within the housing. The system includes a heat exchanger and a circulation loop. The circulation loop includes a supply conduit that leads from the heat exchanger (i.e., that supplies cooling fluid that has passed through the heat exchanger) and a fluid return conduit that leads to the heat exchanger. A pump is operative to circulate cooling fluid through the conduits and the heat exchanger. The chassis further includes a plurality of slots for selectively receiving a plurality of individual electronics modules. Each slot includes a first fluid connector for fluidly connecting a fluid inlet of a received electronics module with the fluid supply conduit. Each slot also includes a second fluid connector for fluidly connecting a fluid outlet of a received electronics module with the fluid return conduit. Accordingly, the pump is operative to circulate cooling fluid through an electronics module when the electronics module is engaged with the first and second fluid connectors. In one arrangement, the connectors are adapted for automatic engagement with the fluid inlets and outlets of a received electronics module. Accordingly, the electronics chassis may provide a self-contained unit that is operative to provide hybrid cooling of electronics modules engaged therein.

In order to provide a self-contained unit, the cooling system may also include a reservoirs of cooling fluid and/or one or more manifolds for supplying cooling fluid to the individual slots within the chassis.

The chassis may utilize connectors that allow for a drip-free connection when an electronics module is engaged therein. Further, such connectors may allow for automatic or near automatic engagement and disengagement with the chassis. In any arrangement, a plurality of electronics modules may share a common cooling system that provides fluid cooling thereof and/or that provides airflow cooling over the electronics modules.

According to another aspect, an electronics module is provided for engagement with a slot of an electronics chassis. The module includes an electronics board supporting one or more electrical components (e.g., power sources, circuit boards, processors, etc.). The electronics board also includes at least a first cooling plate that is thermally contacting a first portion of the electronics board. This cooling plate includes an internal conduit. Interconnected to this internal conduit are inlet and outlet conduits for carrying cooling fluid to and from the cooling plate. The ends of these inlet and outlet conduits include connectors for fluidly connecting the conduits with an external fluid cooling system within an electronics chassis. The module further includes a trigger mechanism that is adapted to move the connectors between open and closed positions. In this regard, the connectors may be engaged with mating connectors when in an open position and may be locked therewith in a closed position.

In a further arrangement, the electronics module may include a second cooling plate that thermally contacts a second portion of the electronics board. This may allow hotspots on the electronics board to be individually cooled with individual cooling plates. In such an arrangement, the second cooling plate may include a second internal conduit that may be interconnected to the inlet and outlet conduits. In this regard, one or more manifolds may be supported on the electronics board/module to divide fluid flow between two or more cooling plates.

In one arrangement, the board is an ATCA compatible board. In another arrangement, the board is housed within a 1 U, 2 U, etc. server module that is adapted to fit within a server rack.

According to another aspect, a method for use in an electronics chassis is provided. The method includes engaging an electronics module with an electronics chassis wherein the module is electrically connected to the chassis and wherein a fluid-cooling path of the electronics module is coupled with a fluid cooling system within the electronics chassis. An airflow may then be established over the surface of the electronics module in conjunction with establishing a cooling fluid flow through the electronics module. Such cooling fluid flow may pass through the electronics module and circulate in a heat exchanger disposed within the chassis. In one arrangement, the airflow that passes over the surface of the electronics module also passes over/through the heat exchanger to provide cooling of the cooling fluid passing there through.

In a further arrangement, engaging may include engaging a plurality of individual electronics modules with the electronics chassis. In this regard, each module may be electrically connected to the chassis, as well as coupled to the fluid cooling system of the chassis. Accordingly, cooling fluid from a plurality of individual electronics modules may be circulated through a common heat exchanger using, for example, one or more common pump(s).

BRIEF DESCRIPTION OF THE DRAWINGS

Exemplary embodiments are illustrated in referenced figures of the drawings. It is intended that the embodiments and figures disclosed herein be considered illustrative rather than limiting.

DETAILED DESCRIPTION

Reference will now be made to the accompanying drawings, which assist in illustrating the various pertinent features of the present invention. Although the present invention will now be described primarily in conjunction with electronics enclosures, it should be expressly understood that the present invention may be applicable to other applications where it is desired to provide cooling. In this regard, the following description of a cooling system for electronics enclosures is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain known modes of practicing the invention and to enable others skilled in the art to utilize the invention in such, or other embodiments and with various modifications required by the particular application(s) or use(s) of the present invention.

The disclosed cooling systems utilize one or more liquid-cooled cold-plates to cool a few high-power dissipating components in an electronics enclosure or on a board in combination with air cooling for the remainder of the enclosure or board. That is, such cold-plates may replace air-cooled heat sinks (e.g., finned aluminum heat sinks) for hot spots of an enclosure or board. These cold plates are part of a liquid-cooling loop that transfer the heat from high power dissipating components to a heat exchanger, which is outside the spatial envelope of the enclosure or board. Likewise, one or more pump(s) for circulating liquid coolant is also outside the spatial envelope of the enclosure or board. This permits interconnecting a liquid-cooled enclosure or board to an electronics chassis or a cabinet or rack that includes parts of, and supports, the liquid cooling system.

As noted, the remainder of the enclosure or board is cooled by air. Accordingly, one or more fans can also be outside the spatial envelope of an enclosure or board for which hybrid cooling (e.g., liquid and air cooling) is provided. The cooled unit, whether it is a single board of a telecom enclosure or a 1 U, 2 U, etc. enclosure, includes cold plates, conduits for carrying liquid coolant and connectors for connection to a liquid coolant system. In this regard, the remainder of the hybrid cooling system such as pump(s), heat exchanger(s), and fan(s) are located in the next packaging hierarchy, for example a chassis or a telecom cabinet or rack.

Figure 1:
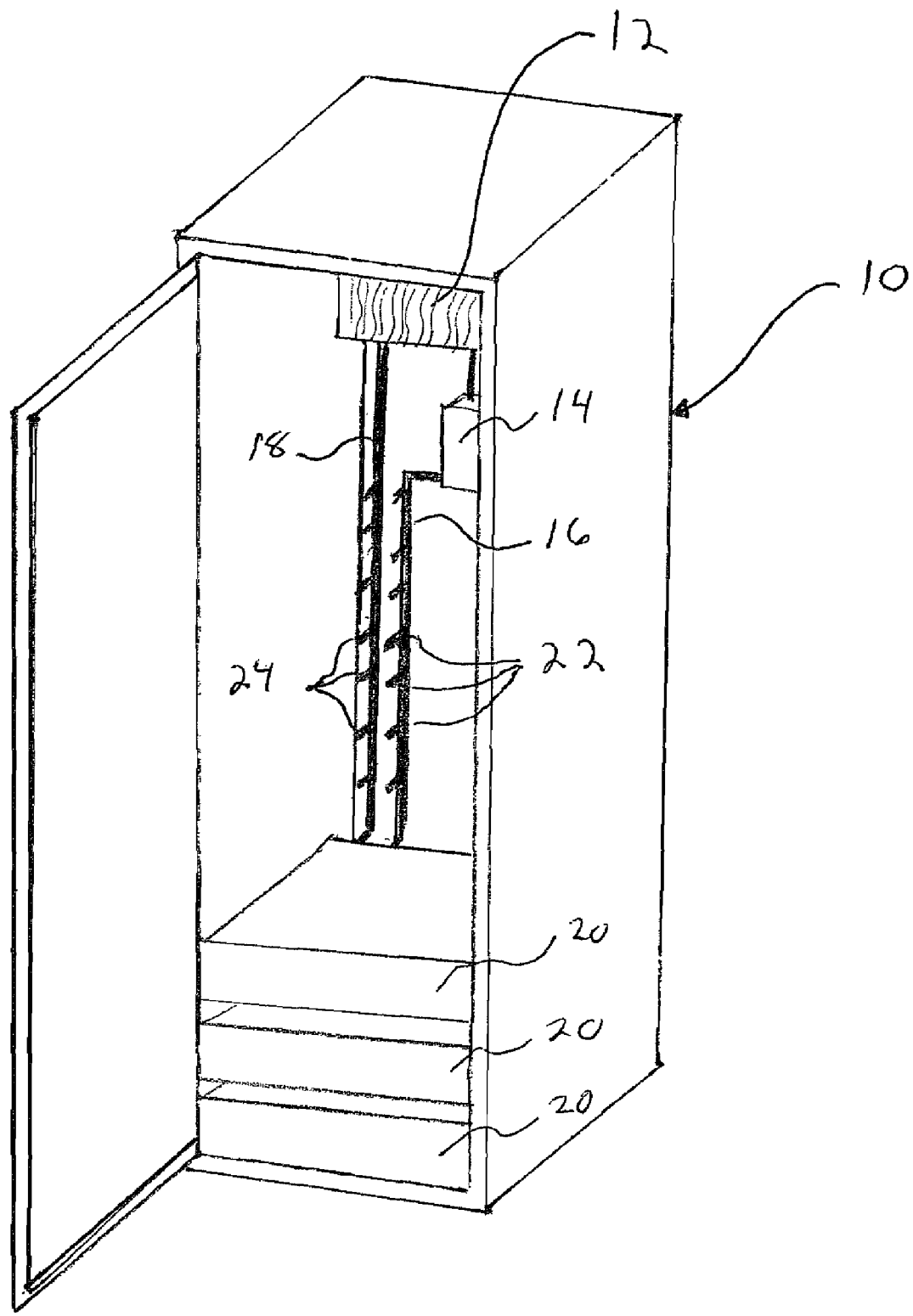
FIG. 1 is one embodiment of an electronics chassis that may utilize a hybrid-cooling system.

FIG. 1, illustrates one exemplary embodiment of a hybrid cooling system that is utilized with electronics modules 20 mounted in a telecom chassis or rack 10. Equipment or modules designed to be placed in the rack are typically described as a rack-mount, a rack mounted system, a rack mount chassis, a subrack, or occasionally, simply a shelf. A U is a common unit of height equal to 1.75 inches. It is used to indicate the vertical usable space, or height of racks (metal frame designed to hold hardware devices) and cabinets (enclosures with one or more doors). Generally, rack and/or cabinet heights and the heights of the equipment which fit into them are all measured in U. Such standardized rack arrangements are widely used throughout the telecommunication, computing, and entertainment industries, as well as others.

The rack 10 also supports heat exchanger(s) 12, pump(s) 14, fan(s) (not shown for purposes of illustration) fluid supply and fluid return conduits 16, 18 that carry coolant to and from the electronics modules which in the present embodiment are server units 20. To permit connection of multiple server units 20 to the fluid supply and return conduits 16, 18, these conduits 16, 18 include a plurality of sets of connectors 22, 24 that are adapted to fluidly mate or couple with inlet and outlet conduits of the server units 20, as will be more fully discussed herein. The rack 10 provides airflow and coolant flow to each individual server unit 20.

In one embodiment, coolant inlet and outlet conduits into and out of the cooled server unit 20 are remotely connected and disconnected, and in some arrangements automatically connected and disconnected, when the server unit 20 is plugged in or out. For example, when a 1 U server unit is slid into the rack 10, a coolant connection is established such that coolant flow through the server 20 may be established. Further, the rack 10 may provide for airflow inside the server 20. Similarly, when the server 20 is removed, the conduits are blocked such that there is no liquid spill inside or outside of the server unit 20. An example of liquid connectors that can be used for these cooling systems is quick connect/disconnect coupling that is currently available in the market. One non-limiting example of such couplings are those available from Colder Products Company of St. Paul, Minn., such as their RPN Series quick couplings. These or similar drip-free couplings and/or a remote system to engage or disengage such couplings may be used in the disclosed cooling systems.

Figure 2:
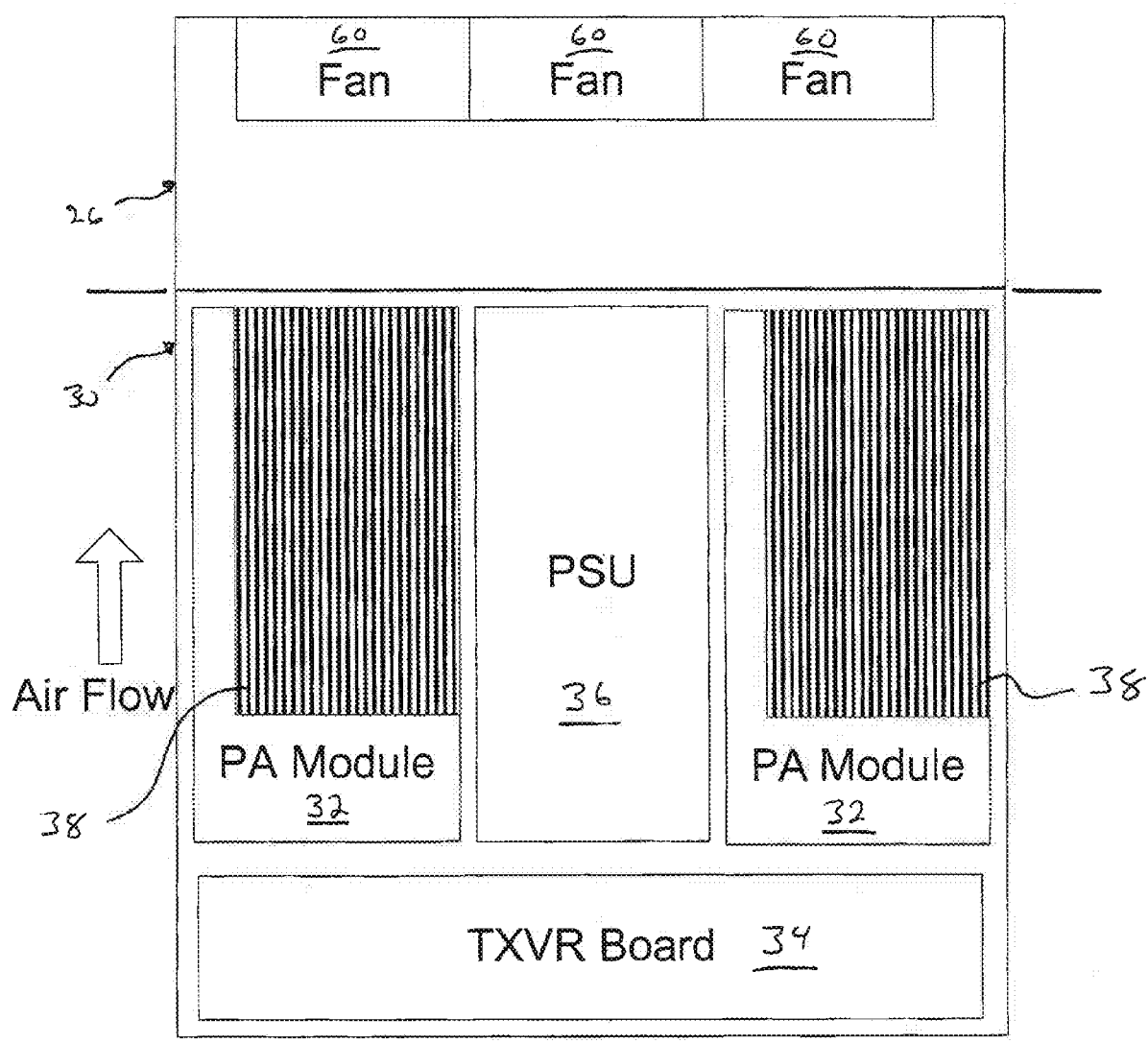
FIG. 2 is a top view of a prior art module or card used in a telecom enclosure.
Figure 3:
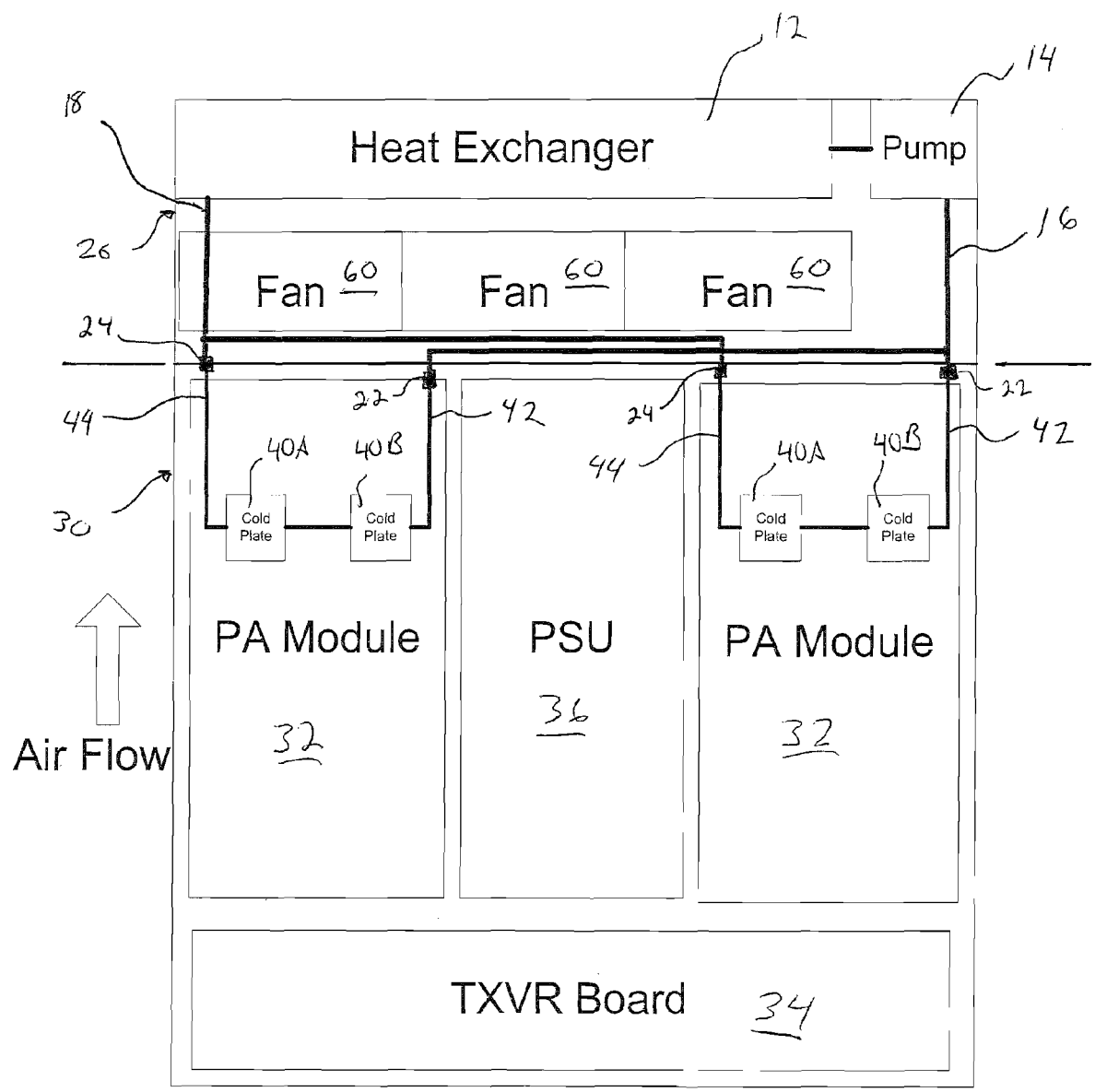
FIG. 3 is a top view of a module or card, showing a liquid-air hybrid cooling system.
Figure 4:
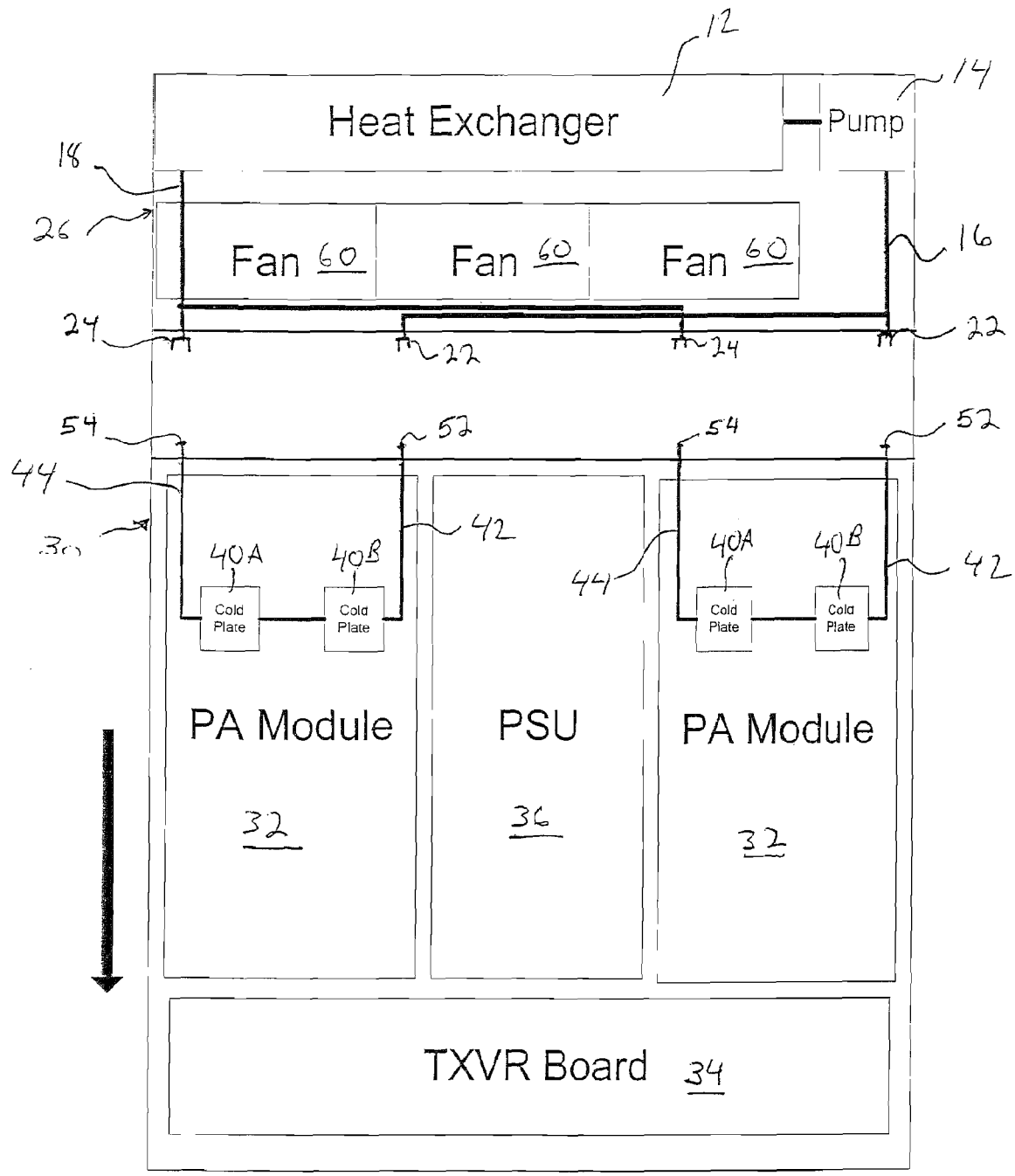
FIG. 4 is a top view of a module or card, showing a liquid-air hybrid cooling system, after the module has been unplugged from a base portion of a telecom enclosure.

FIGS. 2-4 illustrate individual units or electrical modules 30 that may be engaged with a chassis that provides air-flow and/or liquid cooling. FIG. 2, illustrates a traditional air-cooled radio module 30 that is engaged with a chassis 26. For instance, three 1 U-high modules may be stack mounted in a common chassis 26 and may be cooled by three 120 mm×120 mm fans 60. As shown, the module 30 includes two power amplifier (PA) modules 32, one transceiver and receiver (TxRx) board 34, and one power supply unit (PSU) 36. The PA transistors on the PA modules 32 dissipate a significant portion of the total heat dissipated by the entire module 30. Accordingly, when air cooling is utilized alone, large heat sinks 38 (e.g., finned aluminum or copper heat sinks) are required in addition to high airflow rates to properly cool the PA transistors in PA modules 32. As shown, the fans 60 are located on the exhaust side to pull air across the module 30. Thus, the fans 60 draw heated air there through, which may reduce the life expectancy of the fans.

FIG. 3 shows a schematic of one embodiment of a hybrid-cooled solution for the module 30 of FIG. 2. As shown, two liquid-cooled cold plates 40A, 40B are used to cool the PA transistors in each PA module 32 and the remainder of the module 30 is cooled by airflow caused by the fans 60. These liquid-cooled cold plates 40A, 40B include an internal passageway for carrying cooling fluid and are in thermal contact with components for which they provide cooling. Such thermal contact may be established in any way including, without limitation, using thermally conductive adhesives.

As shown, the fans 60 are moved forward in the chassis 26 (relative to their position in FIG. 2) to create space for a heat exchanger 12 and pump 14 of the liquid cooling system. Further, fluid supply 16 conduits and return conduits 18, are fluidly connected to the heat exchanger 12 and pump 14. These conduits 16, 18 are interconnected to inlet and outlet conduits 42, 44, respectively, of the module 30 by first and second fluid connectors 22, 24. Accordingly, when the conduits 42, 44 of the module 30 are connected to the fluid supply and return conduits 16, 18, the pump 14 may circulate coolant through the module 30 for cooling purposes. In this regard, heat removed from the PA transistors by liquid coolant will be transferred to the heat exchanger 12 behind the fans 60. Air blown across the heat exchanger 12 may remove the heat from the chassis 26. Further, the heat may be removed from the coolant before the coolant enters the pump 14 and is recirculated through the cold plates 40A, 40B. As the fans 60 are upstream of the heat exchanger 12, they are exposed to air that is cooler than the air provided to the fans in FIG. 2, as the air in FIG. 2 is heated by the heat sinks 38. Further, less airflow is required in the embodiment of FIG. 3 as the cooling liquid system removes a significant portion of the heat. Accordingly, lower fan speeds may be utilized, which may reduce noise and/or cost and increase the useful life of these fans.

FIG. 4 illustrates the module 30 of FIG. 3 being removed from the chassis 26. As shown, the fluid supply and return conduits 16, 18, are disconnected from the inlet and outlet conduits 42, 44 of the module 30. In this regard, the connectors 22, 24 of the chassis are disengaged from the mating inlet and outlet connectors 52, 54 of the module. Disconnecting the mating connectors may be performed remotely using, for example, a blind-mate connection. Of note, the fans may continue running to provide air and cool the liquid for the other modules, which may remain inside the chassis. Likewise, liquid coolant may be provided to remaining modules. When a module 30 is inserted back into the chassis 26, connectors of the various conduits are reconnected to reestablish a fluid flow path through the liquid cooling cold plates. It will be appreciated that similar hybrid-cooling system may be used for cooling 1 U, 2 U, 3 U-high or other servers which are mounted on a server rack. In such arrangements, the servers will include cold plates and their associated conduits/piping while the rack will include heat exchanger(s), pump(s) and fan(s).

FIGS. 5-8 variously illustrate perspective and cross-sectional views of another exemplary electronics chassis 100. In the embodiment illustrated in FIG. 5, the chassis 100 is a chassis that conforms to ATCA specifications and includes a metal housing having four vertical sidewalls that house a plurality of electronic boards 200 or "blades." Specifically, the chassis 100 includes a front wall 102, a back wall 104, two sidewalls 106 and 108, as well as top and bottom walls 110 and 112. The chassis 100 may be composed of any suitable material including, but not limited to, plastic, steel and aluminum. Further, the physical dimensions of the chassis 100 may also vary according to intended use and/or chassis specific specifications.

Figure 5:
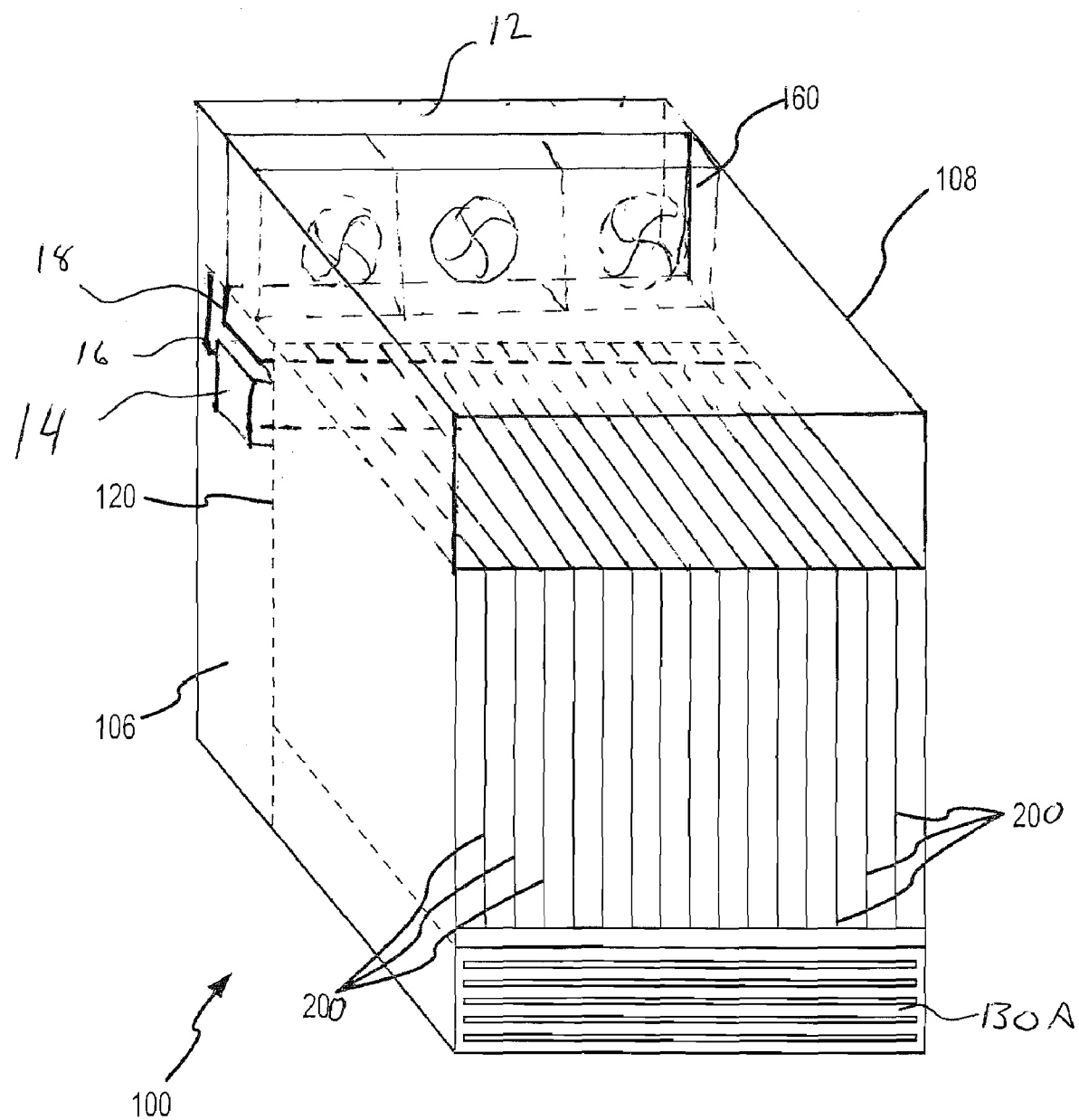
FIG. 5 is another embodiment of an electronics chassis that may utilize a hybrid-cooling system.

As shown in FIG. 5, the chassis 100 houses a plurality of electronic cards or boards 200. More specifically, illustrated chassis 100 houses sixteen electronic boards 200 that are disposed in parallel fashion and extend from the front wall 102 towards the backplane 120 that is spaced from the back wall 104. In another arrangement, the electronic boards 200 may extend from the front wall 102 to the back wall 104. In another dimension, the electronic boards extend vertically from the top of a lower plenum 132 to the bottom of an upper plenum 142. Further, the electronic boards 200 are spaced relative to one another such that air may flow between each individual board for cooling purposes.

As will be appreciated, the electronic boards 200 generate heat during operation and, in the case of air-cooled chassis, must be cooled during operation by, at least in part, air flowing through the chassis 100. To provide the desired airflow, one or more fan units 60 are utilized to draw air through the electronics chassis for cooling purposes. In this regard, the fan units 60 may be operative to draw ambient air through a lower inlet 130A, into a lower plenum 132 (See FIGS. 4-6), through one or more filters (not shown), vertically between the electronics boards 200 into an upper plenum 142, through the fans 60 and out of the chassis 100. Further, for a hybrid-cooled chassis, air may be drawn horizontally through an upper inlet 130B, across the top plenum 142 through the fans 60 and out of the chassis 100. As the air passes across components on the electronics board 20, heat is carried away.

Figure 6:
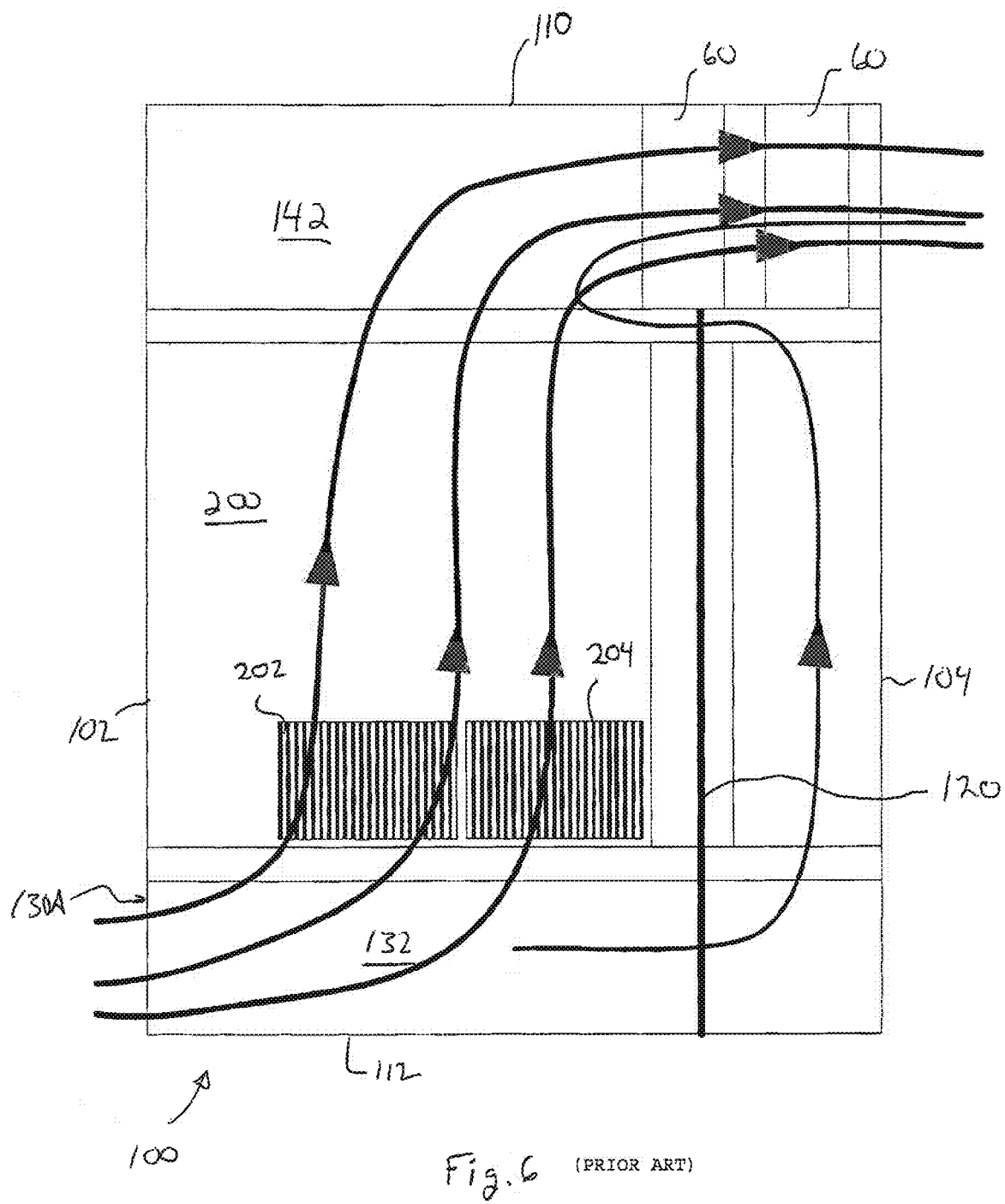
FIG. 6 is a side view of a prior art board in a chassis.

FIG. 6 shows a side schematic view of an air-cooled server board 200 inside a chassis 100 that provides air cooling only. The board 200 has two processors that generate a major portion of total heat. Air enters through the lower inlet 130A, into the lower plenum 132, makes a 90° turn and passes over the board 200 and after making another 90° turn passes through the fans 60 and is exhausted out of the chassis 100. The processor speed, and therefore the board capability, is limited by the cooling capacity of the chassis. The cooling capacity of the chassis is limited by the fan airflow rate, the allowable noise limit, the power density, and the size and specification of the heat sinks 202, 204 used for these processors.

Figure 7:
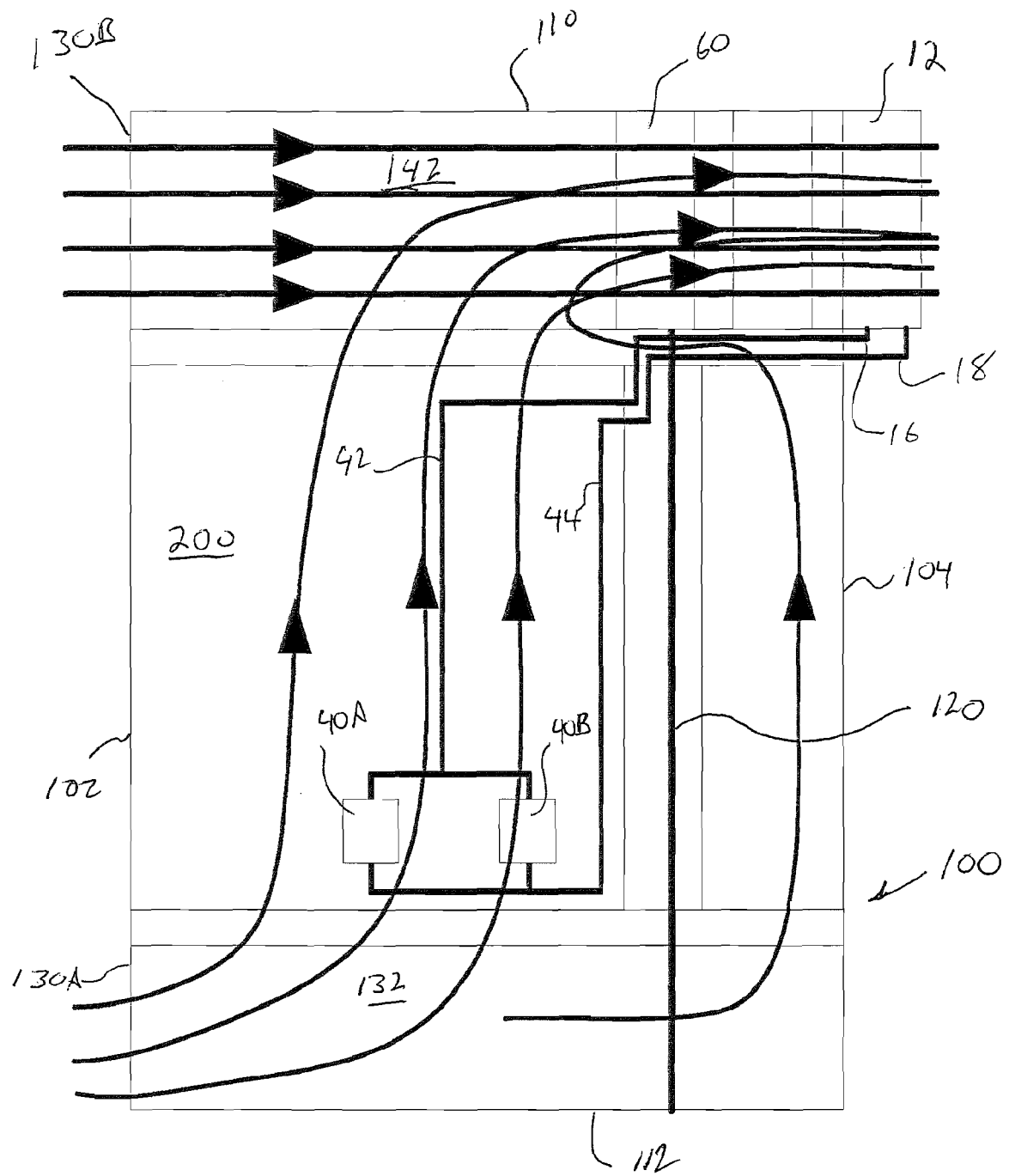
FIG. 7 is a side view of a liquid-air hybrid cooling board in a chassis.
Figure 8:
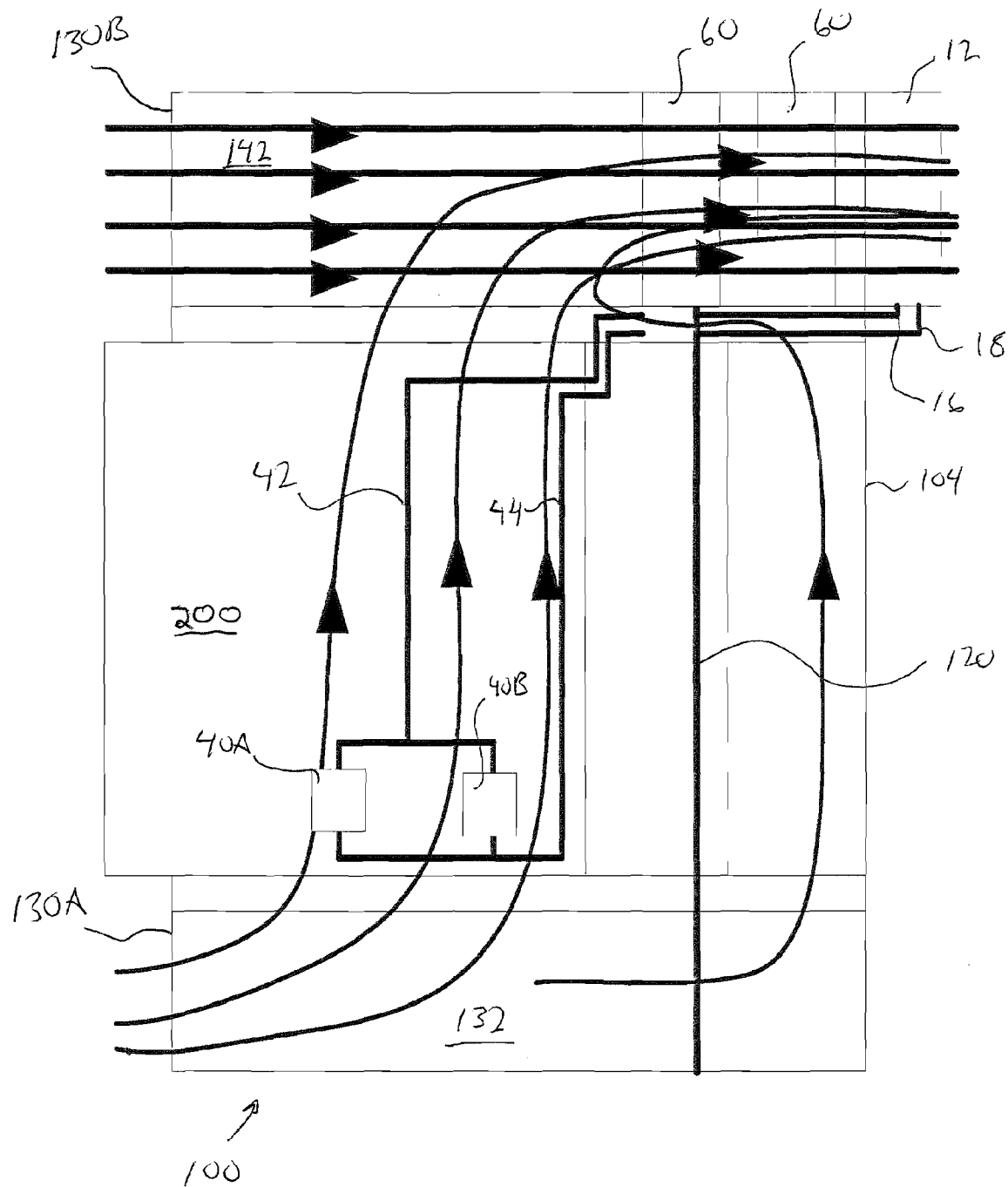
FIG. 8 is a side view of a liquid-air hybrid cooling board in a chassis, after a board has been unplugged from the chassis.

FIG. 7 shows a side schematic view of the hybrid-cooled solution for the chassis 100. In this embodiment, the processors are cooled by cold plates 40A, 40B and the cooling liquid passing through the cold plates 40A, 40B is cooled in a heat exchanger 12 which is mounted behind the fans 60. Again, a pump 14 (see FIG. 5) is fluidly connected to the heat exchanger 12 as well as fluid supply conduits 16 and return conduits 18 to which cooling loops (e.g., inlet and outlet conduits) of multiple boards 200 may be connected. As shown in FIG. 8, there are connection points between the inlet and outlet conduits 42, 44 on the board 200 and the supply and return conduits 16, 18 coming from the heat exchanger 12 and pump 14. Such connection may be performed in a manner similar to that discussed above in relation to FIGS. 3 and 4. As shown, FIG. 8 illustrates a board 200 being moved out of the chassis 100. Accordingly, the conduits of the board 200 and chassis 100 are disconnected. Again, such disconnection may be a drip-free disconnect. The connection will be re-established when the board 200 is plugged in again. In any case, due to the liquid cooling provided to the major heat generating components (e.g., processors) of the board 200, less airflow over the board is required.

Figure 9A:
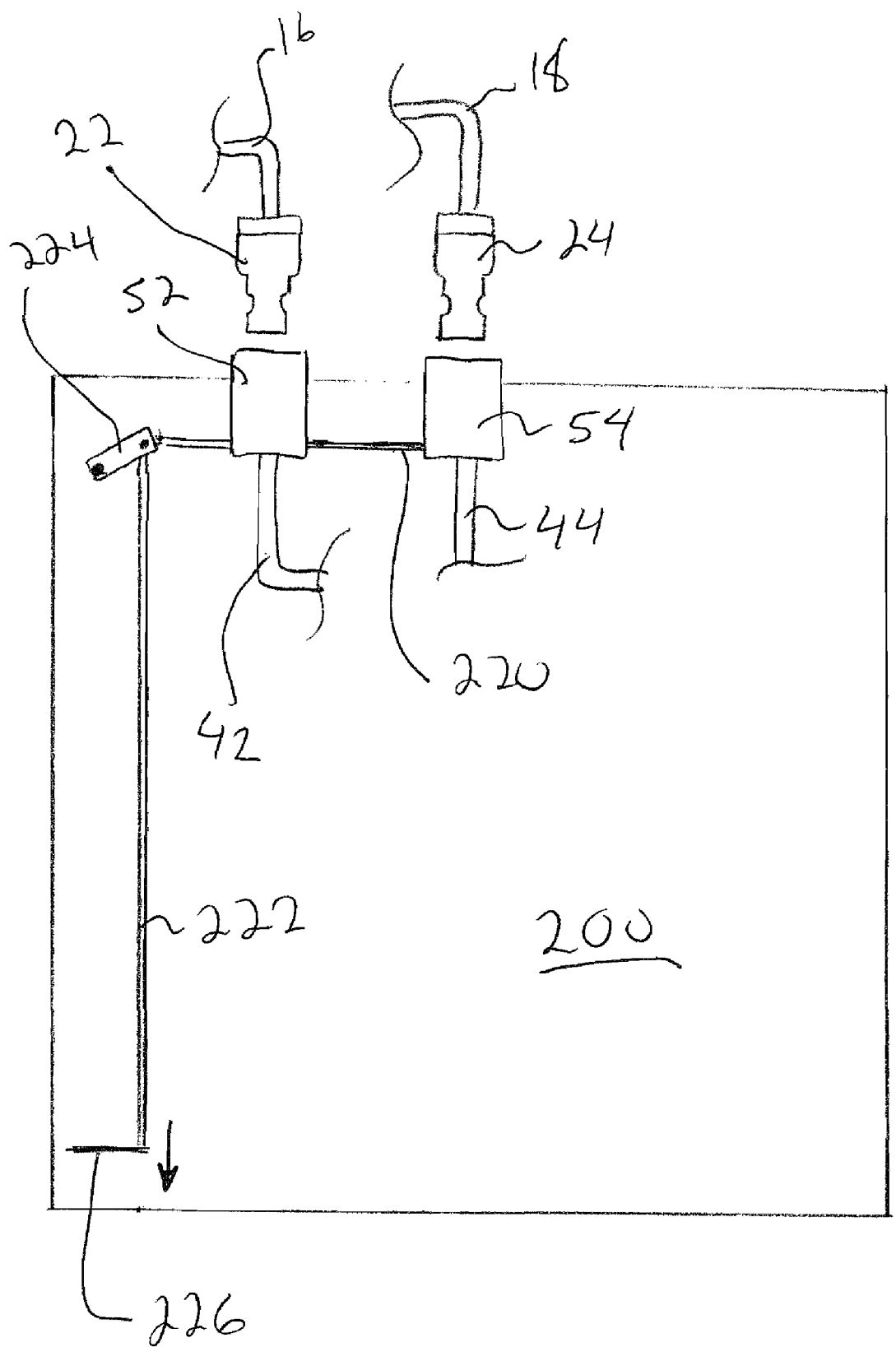
FIGS. 9A-9C illustrate one mechanism for remotely engaging connectors of a liquid cooling system.
Figure 9B:
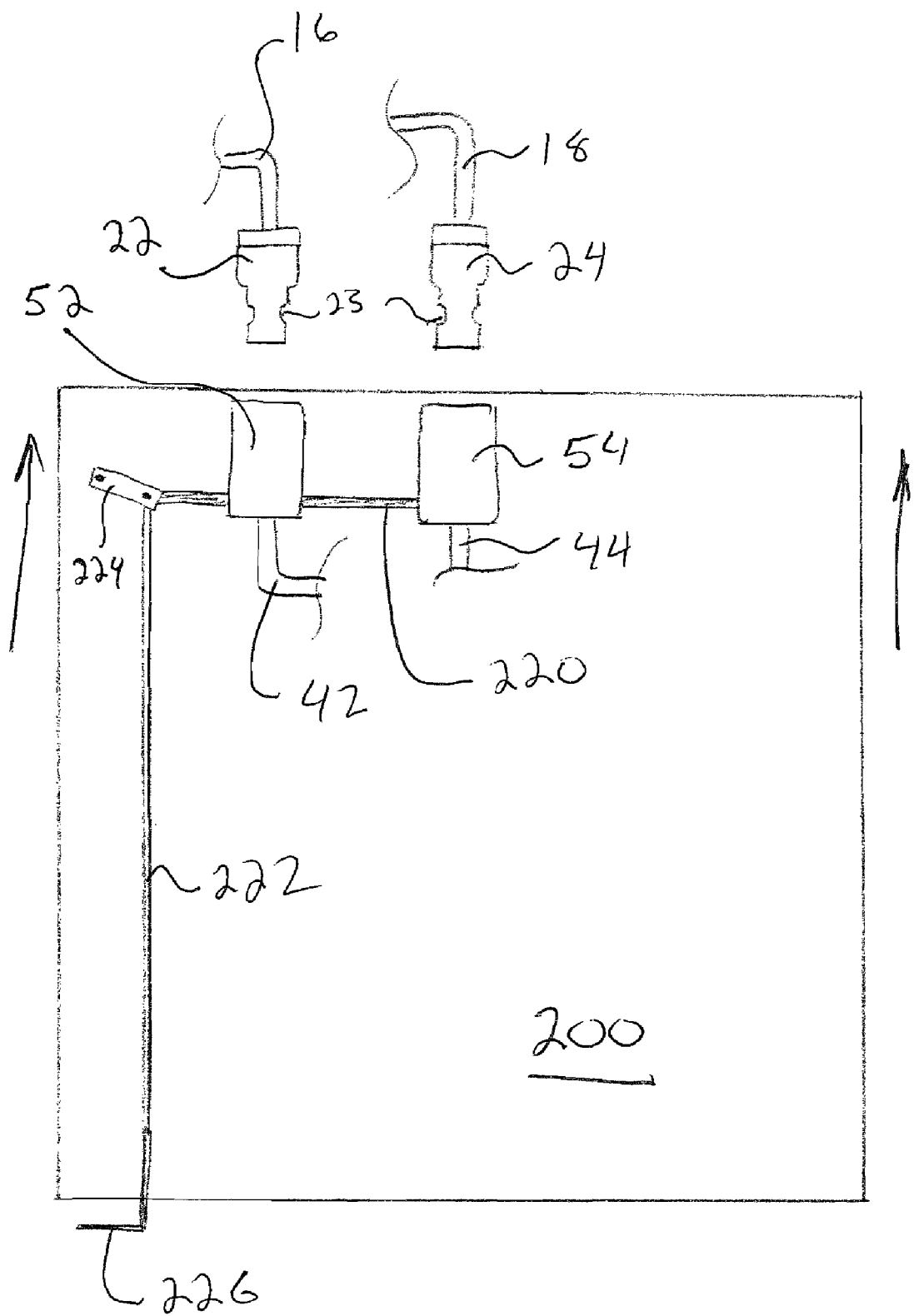
Figure 9C:
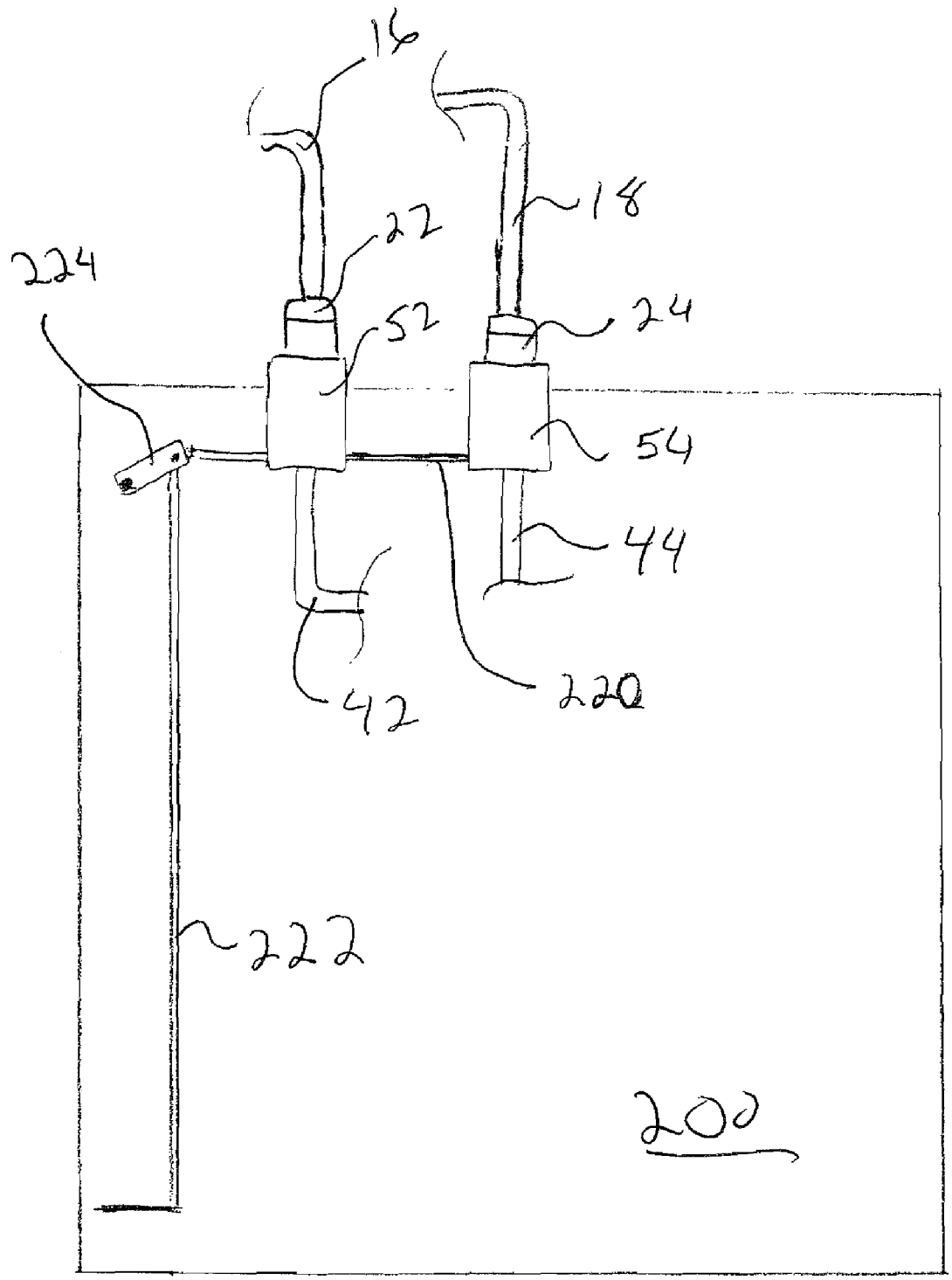

FIGS. 9A-9C show one exemplary embodiment of the trigger mechanism 220 for remotely engaging and disengaging connectors that interconnect the inlet and outlet conduits 42, 44 of a board 200 and the fluid supply and return conduits 16, 18 of a chassis (not shown). In the embodiment shown, female connectors 52, 54 are mounted to the inlet and outlet conduits 42, 44 of the board 200. These female connectors 52, 54 are adapted to receive male connectors 22, 24. In this regard, it may be desirable and/or necessary to retract the female connectors 52, 54 such that the male connectors 22, 24 may be engaged therein. That is, the male connectors 22, 24 may be engaged within the female connectors 52, 54, such that internal structure of the female connectors engages one or more detents 23 along the length of the male connectors 22, 24.

In the present arrangement, the trigger mechanism is located on the board 200. The trigger mechanism includes a first armature 220 that interconnects the first and second female connectors 52, 54. A second armature 222 extends to the front of the board 200. The first and second armatures 220, 222 are movably interconnected on a common end of a lever 224. A second end of the lever 224 is rotably connected to the board 200. A spring may be incorporated into the lever 224 such that it is maintained in a predetermined position. The second end of the second armature 222 includes a trigger 226 that allows a technician to displace the armature 222. Accordingly, the armature 222 may be displaced towards the user in the direction shown by the arrow in FIG. 9A. This causes the lever 224 to rotate about its second end. Likewise, the first armature 220 interconnected to the lever 224 is displaced towards the side of the board 200, as shown in FIG. 9B. At such time, the male connectors 22, 24 may be positioned within the female connectors 52, 54. As will be appreciated, such engagement may be in conjunction with movement of the board towards the male connectors 22, 24. Once engaged, the user may release the trigger 226 such that the male connectors 22, 24 are firmly engaged with the female connectors 52, 54. See FIG. 9C. In the present embodiment, the trigger mechanism is mounted to the board 200. However, it will be appreciated that similar trigger mechanisms may be mounted on the chassis. What is important is a mechanism that allows for switching the mating connectors between open and closed positions such that electronic modules/boards may be conveniently inserted and/or removed from a chassis.

Any other combination of all the techniques discussed herein is also possible. The foregoing description has been presented for purposes of illustration and description. Furthermore, the description is not intended to limit the invention to the form disclosed herein. While a number of exemplary aspects and embodiments have been discussed above, those of skill in the art will recognize certain variations, modifications, permutations, additions, and sub-combinations thereof. For instance, while the above aspects have been discussed as utilizing liquid coolants, it will be appreciated that gaseous coolants may be utilized as well. It is therefore intended that the following appended claims and claims hereafter introduced are interpreted to include all such variations, modifications, permutations, additions, and sub-combinations as are within their true spirit and scope.

What is claimed is:

1. An electronics chassis system comprising:
  a housing defining an interior area, said housing having four vertical walls including a front wall, a back wall, and two sidewalls, said housing further including an upper plenum having a upper air inlet opening in said front wall and a lower plenum having a lower air inlet opening in said front wall;
  a fluid cooling system disposed within said housing, said fluid cooling system including:
  a heat exchanger mounted in said upper plenum of the housing proximate to an outlet opening through said back wall of said housing;
  a fluid supply conduit leading from the heat exchanger to a backplane;
  a fluid return conduit leading from the backplane to the heat exchanger; and
  a pump for circulating cooling fluid through said conduits and said heat exchanger;
  a plurality of slots disposed below the upper plenum and above said lower plenum of said housing for selectably receiving a plurality of individual electronics modules in vertical alignment between the two sidewalls, wherein said slots are spaced to provide vertical airflow channels between said lower plenum and said upper plenum, each said slot including:
    a first fluid connector located at the backplane for fluidly connecting a fluid inlet of a received electronics module with said fluid supply conduit;
    a second fluid connector located at the backplane for fluidly connecting a fluid outlet of a received electronics module with said fluid return conduit, wherein said pump is operative to circulate cooling fluid through an electronics modules when the electronics module is engaged with the first and second fluid connectors; and
  a fan disposed within the upper plenum of said housing proximate to said back wall and said heat exchanger for displacing air through said interior area, wherein said fan is operative to:

draw a first airstream into said lower air inlet opening in said lower plenum below said slots, through said vertical airflow channels, across electronics modules disposed in said slots and into said upper plenum;

draw a second airstream into said upper air inlet opening into said upper plenum, wherein said first and second airstreams combine in said upper plenum to form a combined airstream; and draw the combined airstream across said fan and displace said combined airstream across said heat exchanger and out said outlet opening.

2. A chassis as defined in claim 1, wherein said first and second fluid connectors of at least two slots are fluidly connected to a common heat exchanger.

3. A chassis as defined in claim 1, wherein said fluid cooling system further includes:

a cooling fluid reservoir.

4. A chassis as defined in claim 1, wherein said first and second fluid connectors seal to prevent the passage of cooling fluid in the absence of an electronics module being connected thereto.

5. A chassis as defined in claim 1, wherein the first and second fluid connectors of each of said plurality of slots are adapted to couple automatically with the fluid inlet and fluid outlet of an electronics module when the electronics module is fully engaged with one of the plurality of slots.

6. A method for use in an electronics chassis system, comprising:

engaging at least first and second electronics modules within an electronics chassis, wherein said modules are electrically connected to said chassis and wherein a fluid cooling path of each said electronics module is automatically coupled at a backplane of the electronic chassis with a fluid cooling system within the electronics chassis;

establishing a first air flow over a surface of each said electronics module; wherein establishing the airflow comprises drawing air into an inlet opening though a front wall of said chassis into a lower plenum of the electronics chassis below said modules and drawing said air vertically between said modules into an upper plenum above said modules using a fan disposed within said upper plenum of said chassis and proximate to a back wall of said chassis;

establishing a cooling fluid flow through said electronics module wherein cooling fluid circulates through said fluid cooling path and a heat exchanger within said chassis, wherein said heat exchanger is disposed in said upper plenum between said fan and an outlet opening in said back wall;

establishing a second airflow into the upper plenum of the electronics chassis via an inlet opening in the front wall of said chassis into said upper plenum, using the fan disposed in the upper plenum, wherein said second airflow bypasses said electronics modules; and wherein the first and second airflows mix in said upper plenum between said front and back walls to form a third airflow, wherein said fan exhausts said third airflow across said heat exchanger and out of the electronics chassis via said outlet opening in the back wall of said chassis.

7. The method of claim 6, wherein engaging comprises engaging a plurality of individual electronics modules within said electronics chassis, wherein each module is electrically connected to said chassis and wherein a fluid cooling path of each said electronics module is automatically coupled with said fluid cooling system.

8. The method of claim 7, wherein cooling fluid from said plurality of individual electronics modules is circulated through a common heat exchanger.

9. The method of claim 7, wherein said first airflow over a surface of said electronics module is established over a surface of each of said plurality of individual electronics modules.

10. The method of claim 9, wherein said first airflow over a surface of each of said plurality of individual electronics module is established using a common set of fans disposed within said upper plenum of said chassis.

11. The method of claim 6, wherein engaging further comprises:

coupling an input conduit of said fluid cooling path with a cooling fluid supply conduit within said chassis; and coupling an output conduit of said fluid cooling path with a cooling fluid return conduit within said chassis.

* * * * *